United States Patent [19]
Dai et al.

[11] Patent Number: 5,935,762
[45] Date of Patent: Aug. 10, 1999

[54] TWO-LAYERED TSI PROCESS FOR DUAL DAMASCENE PATTERNING

[75] Inventors: Chang-Ming Dai; Jammy Chin-Ming Huang, both of Hsinchu, Taiwan

[73] Assignee: Industrial Technology Research Institute, Hsin-Chu, Taiwan

[21] Appl. No.: 08/949,358

[22] Filed: Oct. 14, 1997

[51] Int. Cl.$^6$ .................................................. G03F 7/26
[52] U.S. Cl. ........................... 430/312; 430/314; 430/316; 438/724
[58] Field of Search ..................... 430/312, 313, 430/314, 316, 317, 330; 438/723, 724

[56] References Cited

U.S. PATENT DOCUMENTS

| | | | |
|---|---|---|---|
| 5,094,936 | 3/1992 | Misium et al. | 430/313 |
| 5,312,717 | 5/1994 | Sachdev et al. | 430/313 |
| 5,384,220 | 1/1995 | Sezi et al. | 430/313 |
| 5,427,649 | 6/1995 | Kim et al. | 156/661.11 |
| 5,487,967 | 1/1996 | Hutton et al. | 430/322 |
| 5,514,247 | 5/1996 | Shan et al. | 216/67 |
| 5,529,953 | 6/1996 | Shoda | 437/189 |
| 5,545,512 | 8/1996 | Nakato | 430/323 |
| 5,550,007 | 8/1996 | Taylor et al. | 430/314 |
| 5,602,053 | 2/1997 | Zheng et al. | 437/60 |
| 5,614,765 | 3/1997 | Avanzino et al. | 257/774 |
| 5,635,333 | 6/1997 | Peterson et al. | 430/311 |
| 5,635,337 | 6/1997 | Bartha et al. | 430/313 |
| 5,635,423 | 6/1997 | Huang et al. | 437/195 |
| 5,686,354 | 11/1997 | Avanzino et al. | 437/190 |
| 5,741,626 | 4/1998 | Jain et al. | 430/314 |
| 5,756,256 | 5/1998 | Nakato et al. | 430/272.1 |

OTHER PUBLICATIONS

S. Waf et al. "Silicon Processing For The VLSI Era"—vol. 1, Lattice Press, Sunset Beach, CA, 1986, p. 443.

*Primary Examiner*—Kathleen Duda
*Attorney, Agent, or Firm*—George O. Saile; Stephen B. Ackerman

[57] ABSTRACT

A new method is disclosed for forming dual damascene patterns using a silylation process. A substrate is provided with a tri-layer of insulation formed thereon. A first layer of silylation photoresist is formed on the substrate and is imaged with a hole pattern by exposure through a mask. Using a silylation process, which greatly improves the depth of focus by reducing reflections from the underlying substrate, the regions in the first photoresist adjacent to the hole pattern are affixed to form top surface imaging mask. The hole pattern is then etched in the first photoresist. A second layer of photoresist is formed, and is imaged with a line pattern aligned with the previous hole pattern by exposure through a mask. The line pattern in the second photoresist is etched. The hole pattern in the first photoresist is transferred into the top layer of composite insulation first and then into the middle etch-stop layer by successive etching. The line pattern in the second photoresist layer is transferred into the first photoresist layer through a subsequent resist dry etching process. Finally, the line pattern and the hole pattern are transferred simultaneously into the top and lower layers of the composite insulation layer, respectively, through a final dry oxide etching. Having thus formed the integral hole and line patterns into the insulation layer, metal is deposited into the dual damascene pattern. Any excess metal on the surface of the insulating layer is then removed by any number of ways including chemical-mechanical polishing, thereby planarizing the surface and readying it for the next semiconductor process.

27 Claims, 5 Drawing Sheets

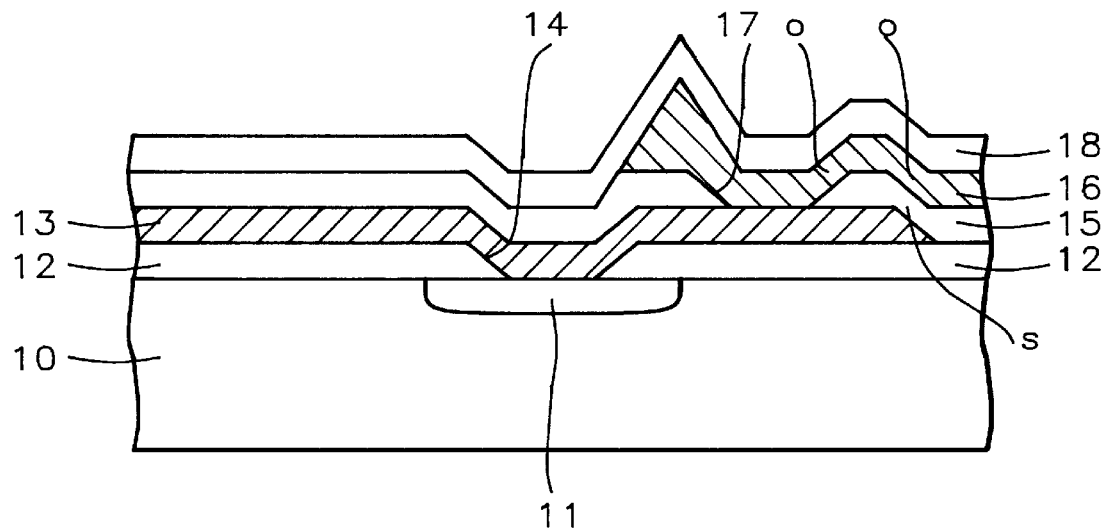
FIG. 1 – Prior Art
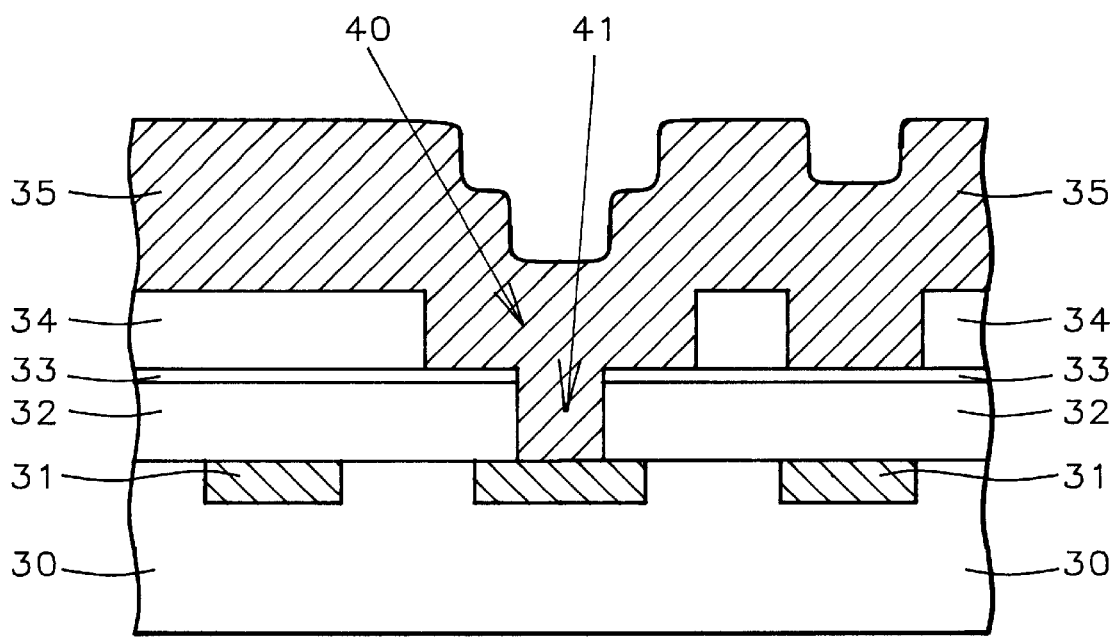
FIG. 2a – Prior Art

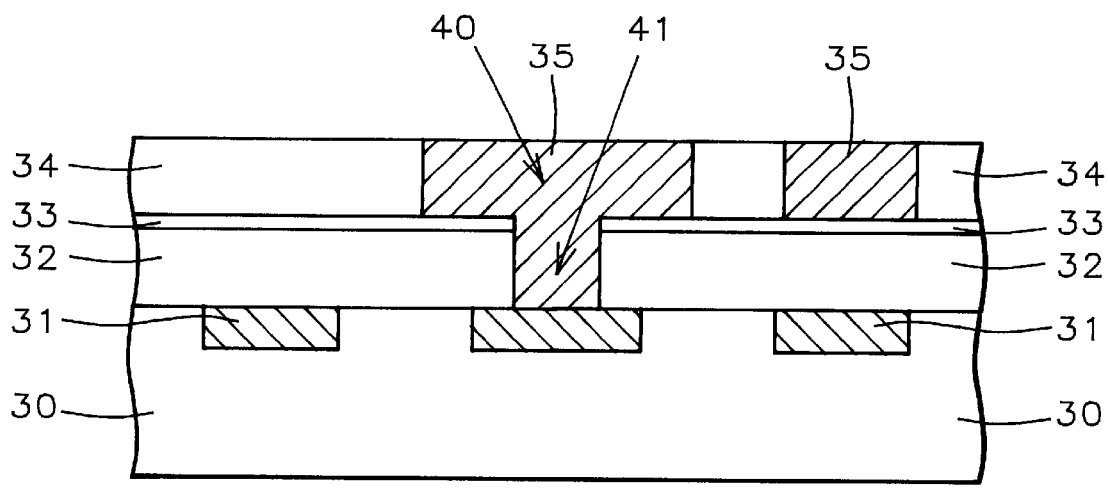
FIG. 2b - Prior Art
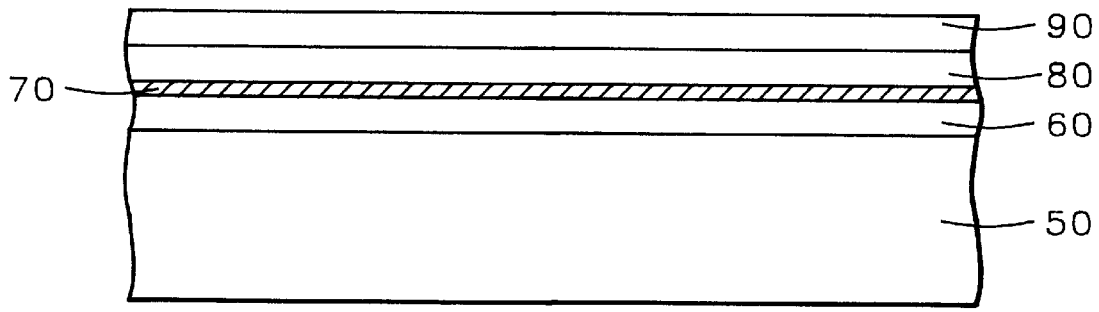
FIG. 3a
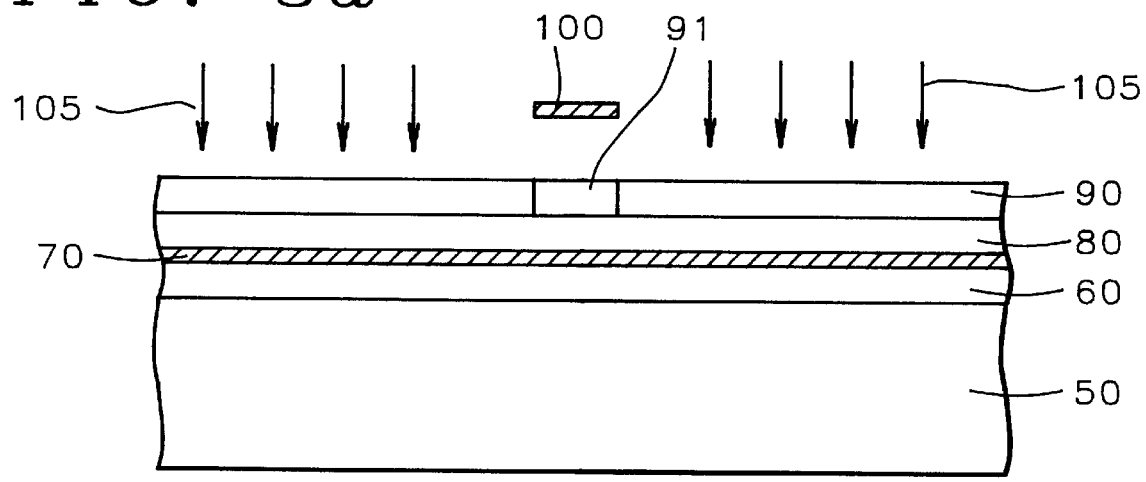
FIG. 3b

TWO-LAYERED TSI PROCESS FOR DUAL DAMASCENE PATTERNING

RELATED APPLICATIONS

U.S. patent application by the same inventor C. M. Dai filed on Oct. 14, 1997, Ser. No. 08/949,350 entitled "Dual Damascene Process Using Single Photoresist Process"; filed on Oct. 14, 1997, Ser. No. 08/949,353 "Single-mask Dual Damascene Processes by Using Phase-shifting Mask"; filed on Oct. 14, 1997, Ser. No. 08/949,354 entitled "Self-Aligned Dual Damascene Patterning Using Developer Soluble ARC Interstitial Layer"; and filed on Oct. 14, 1997, Ser. No. 08/949,352 entitled "Opposed Two-Layered Photoresist Process for Dual Damascene Patterning", assigned to common assignee.

BACKGROUND OF THE INVENTION

(1) Field of the Invention

The present invention relates to the manufacture of ultra large scale (ULSI) semiconductor chips in general, and in particular, to an integrated method of forming interconnect layers using a dual-layered top surface imaging (TSI) process as an improvement for dual damascene metal wiring technology.

(2) Description of the Related Art

The significance of the use of the presently disclosed dual layer photoresist process in the ULSI technology becomes more apparent when one considers the challenges associated with the forming of interconnections in the high performance chips of related art.

In order to affect more readily the migration of the very large scale integrated (VLSI) technology towards the ULSI technology for higher speed and performance of computers, the semiconductor industry has been providing in rapid succession new techniques and technologies for manufacturing very tightly packed semiconductor chips. As is well known by those versed in the art, closer proximity of devices in a tightly packed chip not only provides higher propagation speed of electrical signals by the sheer reduction in the traveled distance between the devices, but also by the reduced impedance encountered in the shortened medium through which the signals travel. On the other hand, tightly packed, ultra large scale integration can be achieved with only ultra small devices and interconnections.

The interconnections in turn must be formed in a such a manner so as to minimize the increased resistance to signal propagation through the reduced cross-section of the wiring metal stripes. It is especially important to avoid mating contacts and favor solid connections where possible.

A semiconductor chip normally contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. In prior art, there are many different methods of forming metal lines and interconnections between them. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

To provide robust contact area at the junction where the metal lines contact the devices or the via plugs in the case of multilayer wiring, it is usually necessary to increase the dimensions of the various features in the metal line and the holes to compensate for overlay errors and process bias inherent in lithographic process. This increase in the size of the design ground rules results in a significant loss in circuit layout density. Furthermore, there is considerable development effort expended on photolithographic equipment and processes to make improvement in overlay error and process tolerances. To minimize the chip area devoted to overlay tolerance and lithography costs, several "self-aligned" processes have been developed by workers in the field.

There are also other problems associated with forming contacts between metal layers in a substrate. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates an irregular and nonplanar surface which makes it difficult to fabricate the subsequent interconnecting layers as shown in FIG. 1.

The structure shown in FIG. 1 is a typical example of a semiconductor substrate fabricated using prior art techniques. After having defined device regions represented by reference (11) on substrate (10), a first insulating layer (12) is formed and patterned thereon. First level metal layer (13) is next deposited to make contact with region (11) through contact window (14). Similarly, the second level metal layer (16) makes contact with metal layer (13) through via hole (17) patterned in second insulating layer (15). The structure is passivated with a third insulating layer (18). Although the structure depicted in FIG. 1 is not to scale, it exemplifies a very irregular surface which creates reliability problems. One such problem is the potential short at location (S) between the first and second levels of metal layers, due to the thinning of the insulating layer therebetween, and still another one is the risk of a potential open circuit at locations (O, due to the thinning of the metal layer at that location.

One solution that is found in prior art in addressing the problems cited above is the so called Dual Damascene process. In its simplest form, this process starts with an insulating layer which is first formed on a substrate and then planarized. Then horizontal trenches and vertical holes are etched into the insulating layer corresponding, respectively, to the required metal line pattern and hole locations that will descend down through the insulating layer to the underlying features, that is, to device regions if through the first insulating layer, or to the next metal layer down if through an upper insulating layer in the substrate structure. Metal is next deposited over the substrate thereby filling the trenches and the holes, and hence forming metal lines and the interconnect holes simultaneously. As a final step, the resulting surface is planarized using the well-known chemical-mechanical polish (CMP), and readied to accept another dual damascene structure, that is, integrally inlaid wiring both in the horizontal trenches and vertical holes, hence the duality of the process.

A dual damascene structure before and after CMP is shown in FIGS. 2a and FIG. 2b. Two photolithographic processes and two insulator layers separated by an etch-stop layer are employed to achieve the shown structure as follows: a starting planarized surface (30) is provided with patterned first level metal (31). A first layer of insulator (32) is deposited over a fist level of patterned metal to which contacts are to be selectively established. The first layer is planarized and then covered by an etch-stop material (33). Contact holes are defined in the etch-stop material by a first photolithography at locations where vertical plug interconnects are required. The thickness of the first insulator layer (32) is made equal to the desired plug height. The first insulator layer is not etched at this time. Next, a second insulator layer (34), having a thickness equal to the thickness of the second level of patterned metal of the mullet-level structure, is deposited over the etch-stop material (33). The second insulator layer (34), in turn, is etched by second photolithography down to the etch-stop material (33) to define desired wiring channels (40), some of which will be in alignment with the previously formed contact hole (41) in the etch-stop material. In those locations where the contact holes are exposed, the etching is continued into the first insulator layer to uncover the underlying first level of patterned metal. The horizontal channels and vertical holes etched into the second and first insulator layers are next overfilled with metal (35). As a final step, excess metal (35) on top of the second insulator layer (34) but not in the channels (40) or holes (41) is removed by etching or chemical-mechanical polishing, as shown in FIG. 2b.

It will be appreciated by those skilled in the art that the dual damascene process alleviates the problem of registration of holes with metal lines, and the concomitant issue of excessive overlay tolerances. At the same time, wiring can be kept to the minimum ground rules tolerances and also problems associated with the thinning of insulator and/or metal around sloped holes can be circumvented. However, it is also evident that the process is complicated, especially in the area where two photolithographic steps must be performed to form the vertical holes. Here, the hole pattern must first be defined lithographically after the etch-stop has been formed, and also later when the hole is etched lithographically. Furthermore, the etch-stop, which is usually an oxide, has to be formed as an intermediate layer subject to a baking process performed at a high temperature. Facilities for etching the oxide film are additionally needed. The addition of this complicated processing results in lower productivity, increased density, and increased cost.

Nevertheless, in prior art, dual damascene process has been used to advantage. For example, Shoda discloses in U.S. Pat. No. 5,529,953 a method of manufacturing a stud (vertical metal plug) and (horizontal) interconnect in a dual damascene structure using selective deposition where the selective deposition is accomplished through repeated application of masks and photolithographic processes. Similarly, Zheng in U.S. Pat. No. 5,602,053 discloses a dual damascene antifuse structure where sandwiched layers are formed. In another approach, recognizing the multiplicity of mask patterning steps in dual damascene process, Avanzino in U.S. Pat. No. 5,614,765 teaches the use of one mask pattern for the formation of both the conductive lines and the vias simultaneously.

It is advantageous, therefore, to be able to replace the complicated portions of dual damascene process with new methods, and apply the process more effectively to the manufacture of semiconductor substrates and chips. It is disclosed in this present invention that in fact a modified and improved silylation process can be advantageously incorporated to improve the present state of the art of dual damascene process.

SUMMARY OF THE INVENTION

It is therefore an object of this invention to provide a new method of forming dual damascene patterns using top surface imaging process in the manufacture of semiconductor substrates and chips.

It is another object of this invention to integrate silylation process into dual damascene patterning process.

It is still another object of this invention to provide a method for improving the alignment of a wiring layer to underlying interconnect hole pattern.

It is yet another object of this invention to provide a method for reducing overlay tolerances and process bias in order to increase the packing density of ultra large scaled integrated chips.

These objects are accomplished by providing a substrate having a composite layer of insulation deposited thereon, whereby said composite layer comprises a first layer of dielectric separated from a second layer of dielectric by an intervening intermediate layer of dielectric; forming a first layer of silylation photoresist on said composite layer of dielectric insulation; hole patterning said first layer of silylation photoresist by exposing said photoresist using a photo mask; treating a surface portion of said first layer of silylation photoresist with a silylation process thereby forming a silylated layer of silylation regions in said first layer of silylation photoresist; removing portions of said first layer of silylation photoresist using said silylated layer of said first layer of silylation photoresist as a mask; forming a second layer of photoresist on said first layer of silylation photoresist covering said substrate; line patterning said second layer of photoresist by exposing said photoresist using a photo mask; performing wet development, that is, photo developing to remove portions of said second layer of photoresist to form line pattern in said second layer of photoresist; etching through said second layer of dielectric underlying said first layer of silylation photoresist using said silylated layer of said first layer of silylation photoresist as a mask thereby transferring said hole pattern in said first layer of silylation photoresist into said second layer of dielectric; etching through said intermediate layer of dielectric underlying said second layer of dielectric using said silylated layer of said first layer of silylation photoresist as a mask thereby transferring said hole pattern in said first layer of silylation photoresist into said intermediate layer of dielectric; etching said first layer of silylation photoresist through said line pattern in said second layer of photoresist thereby transferring said line pattern from said second layer of photoresist into said fist layer of photoresist; etching said first layer of dielectric using said line pattern in said first and second layers of photoresist as a mask; etching said composite layer of insulation thereby transferring said line pattern in said first layer of silylation photoresist into said second layer of dielectric to form a line trench, and simultaneously transferring said hole pattern in said intermediate layer of dielectric into said first layer of dielectric to form a contact hole; removing said second layer of photoresist; depositing metal into said trench and said hole to form a dual damascene structure; and polishing.

BRIEF DESCRIPTION OF THE DRAWINGS

In the accompanying drawings, similar numerals refer to similar parts throughout the several views.

FIG. 1 is a partial cross-sectional view of a semiconductor substrate showing a non-planar multilayered metal structure resulting from prior art methods.

FIGS. 2a–2b are partial cross-sectional views of a semiconductor substrate showing the conventional forming of a dual damascene structure before and after planarization.

FIG. 3a is a partial cross-sectional view of a semiconductor substrate having a first photoresist layer formed on a composite layer of insulation according to this invention.

FIG. 3b is a partial cross-sectional view of a semiconductor substrate showing the hole patterning of the first layer of silylation photoresist of FIG. 3a, according to this invention.

DESCRIPTION OF THE PREFERRED EMBODIMENTS

Figure 3C:
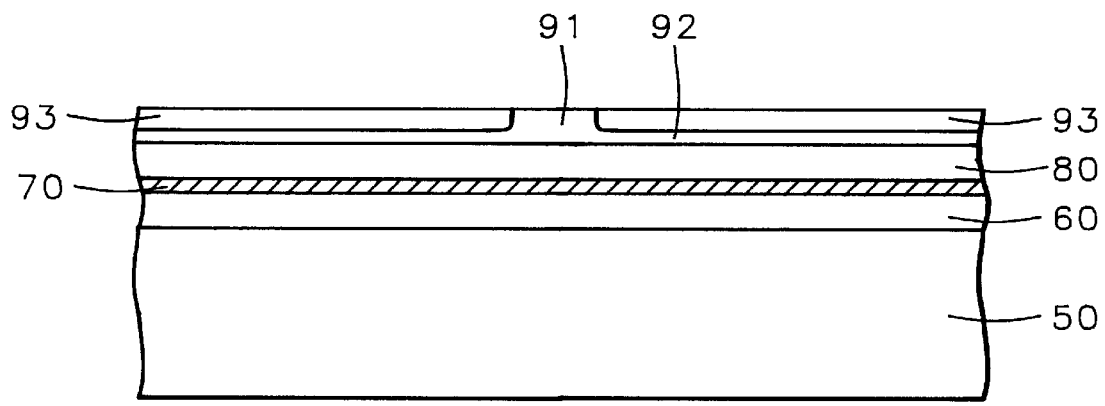
FIG. 3c is a partial cross-sectional view of a semiconductor substrate showing the silylation of the first layer photoresist of FIG. 3b, according to this invention.
Figure 3D:
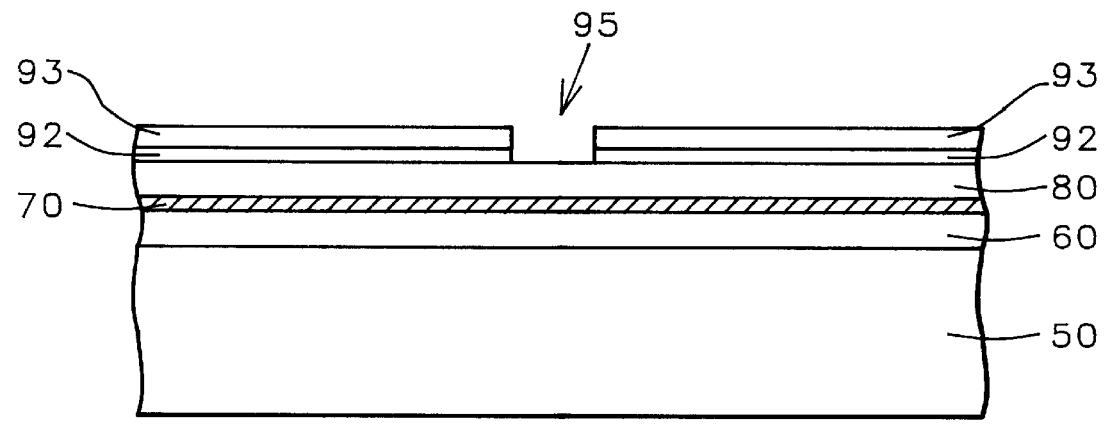
FIG. 3d is a partial cross-sectional view of a semiconductor substrate showing the forming of hole pattern in the first layer of silylation photoresist of FIG. 3c, according to this invention.

Referring now to the drawings, in particular to FIGS. 3a–3k, there are shown schematically steps in forming dual damascene pattern employing dual-layered top surface imaging process in conjunction with silylation process.

In FIG. 3a, substrate (50) is provided with a composite tri-layer dielectric insulation comprising bottom and top layers (60) and (80), respectively, and a middle layer (70). A first layer of silylation photoresist (90) is next formed on the composite layer.

It is preferred that top and bottom layers of insulation, that is, layers (60) and (80), are plasma enhanced chemical vapor deposited (PECVD) phosphosilicate glass (PSG) in a low pressure environment at a chamber pressure between about 0.5 to 1.0 torr, temperature between about 300° C. to 500° C. with reactant gas $SiH_4$ at a flow rate between about 100 to 500 standard cubic centimeters per minute (sccm) in a diluent carrier gas $PH_3$ at a flow rate between about 20 to 200 sccm. TEOS (tetraethyl orthosilicate) oxide can also be used. The thickness of bottom (60) and top (80) layers of dielectric are between about 0.3 to 0.7 micrometers ($\mu m$).

The intermediate layer (70) is an etch barrier film such as silicon nitride (SiN) to prevent the upper line trench patterns of dual damascene from being etched through subsequent etch steps if the layer underlying the composite insulation layer is for via plug hole or contact isolation. (It will briefly be noted here that substrate (50) in FIG. 3a is provided with a substructure of devices formed in the substrate and/or metal layers thereof, and as they are not significant to the invention, they are not described in detail in order not to unnecessarily obscure the present invention.) Other barrier films may be used, however silicon nitride is preferred because it becomes part of the composite insulation layer and has different etch characteristics than that of silicon dioxide ($SiO_2$) or phospho-silicate glass (PSG) layers that can be used as insulation layers. That is, silicon nitride allows a selective etch process with respect to different underlying materials. Spin-on-glass and CVD nitride are also suitable as etch-stop materials when polyimide layers are used. It is preferred that silicon nitride is deposited using plasma enhanced CVD (PECVD and that it has a thickness between about 500 to 2000 angstroms (Å) depending upon the oxide to nitride selectivity.

The surface of layer (80) in FIG. 3a is planarized, preferably using chemical-mechanical polishing process. Etching back or using capping method are also suitable for planarizing the surface of layer (80). Nevertheless, it will be known to those skilled in the art that, especially when the insulation layers are deposited over metal layers, the surface topography can be uneven across the edges and steps of metal lines. In other words, even though the surface (80) is depicted flat in FIG. 3a, it does not show the irregularities on the surface. When photoresist is coated over such a surface, its thickness is altered as it crosses the edges and steps of the metal lines. This is because the resist that crosses the top of the steps is much thinner than the resist that covers regions which are low-lying in between the metal lines. Thus, during the photolithographic process of patterning the photoresist, the thin areas become overexposed and the thicker areas underexposed. Upon development, a resist pattern crossing a step will therefore possess a linewidth variation (i.e., narrower on the top of the step) . For lines in which step heights approach the size of the linewidth (e.g., for linewidths or spaces of 1 $\mu m$ or less), such variation in dimension become intolerable. In addition, standing wave effects in thick resist layers reduces their minimum resolution as explained in S. Wolf and R. N. Tauber, "Silicon Processing for the VLSI Era," vol. 1, Lattice Press, Sunset Beach, Calif. 1986, p. 423. Finally, reflective substrates also degrade resolution in thick resist films. These problems can be overcome by using an MLR process where multi-layer resist is used such that the first layer is thick and planarized and the second layer is the thin image transcribing layer as described in Wolf, same page. However, the resist has to be formed twice and also an oxide film has to be formed as an intermediate layer to act as an etch mask for the lower layer. For dual damascene process, the MLR has to be repeated twice to form both the connecting hole layer and the metal layer. In the present invention, only one photoresist layer is used in forming each of the vertical hole and horizontal metal line patterns while taking advantage of the presence of the two total layers for the reasons given above. This is accomplished by silylating the first photoresist layer whereby a portion of the surface of the photoresist is converted to glass to act as an etch mask. It is found that silylation process not only provides better resolution but also larger depth of focus due to the forming of the image only on the surface, and hence the reduction in the loss of depth of focus and in the reflectivity from the underlying substrate. The underlying dielectric insulation layer is etched using the newly formed glass mask, thus making it unnecessary to use the intermediate layer of the conventional MLR process as shown in FIGS. 3a–3h. The resist thickness for silylation can also be thinner due to its high absorption characteristics.

In FIG. 3a, first layer of silylation photoresist (90) is formed on PSG layer (80). Silylation photoresist (90) can either be a chemical amplification resist (CAR) having a photo acid generator (PAG) agent, or a Novalac based resist having a photo acid compound (PAC) agent. Of the two types, negative (n)-type is used here. Positive (p)-type resist can also be used if reversed tone mask is employed. In either case, first photoresist is used for forming the vertical hole pattern (91) as shown in FIG. 3b. The CAR is made using a photo acid generator (PAG) instead of the conventional photosensitive agent, and examples of (p)-type and (n)-type resists are, respectively, TOKP007 and TOKN908 made by TOK in Japan.

The preferred thickness of first layer of silylation photoresist (90) shown in FIG. 3a is between about 0.4 to 0.8 $\mu$m. Mask (100) is used to expose (105) photoresist layer (90) to form vertical hole pattern (91). The light (105), exposing regions (90) surrounding hole pattern (91), causes the PAG (or PAC) to generate acid which in turn alters the resin in the exposed regions. The exposure is between about 20 to 200 milijoules (mj)/cm$^2$. Next, resist layer (90) is hard baked at a temperature between about 100 to 200° C. to form cross-linking in the unexposed region (91). This is followed by selective silylation reaction of the surface of CAR resist (90) in exposed regions. The silylation process is accomplished by diffusing a silylating agent at a temperature between about 100 to 200° C., which affects the exposed areas (90) and not the cross-linked areas (91) by introducing silicon to the organic compounds in the resist layer (90). Deeper layer (92) also remains unaffected. The net result is the formation of silicon rich, silylated layer (93) with a thickness between about 1000 to 4000 angstroms (Å). The preferred silylating agent in this invention is tetra-methyl di-silazane (TMDS) which includes silicon though hexamethyl disilazane (HMDS), Silane, etc., can also be used. The silylated layer (93) is then used as a mask to etch hole pattern (95) shown in FIG. 3d. Dry etching is accomplished by oxygen (O$_2$) and SO$_2$ gases in a high density plasma (HDP) etcher system, for example, Lam 9400.

Figure 3E:
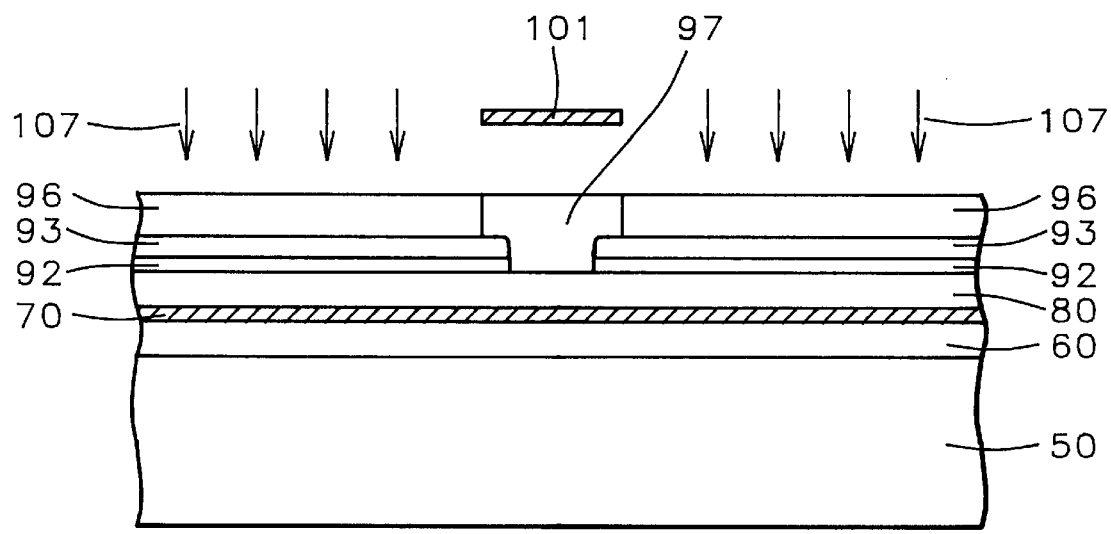
FIG. 3e is a partial cross-sectional view of a semiconductor substrate showing the line patterning of the second layer of photoresist of FIG. 3d, according to this invention.

An (n)-type photoresist is next formed on the substrate over the silylated layer (93) as the second layer photoresist (96) shown in FIG. 3e with a thickness between about 0.2 to 0.8 $\mu$m. The metal line pattern of the dual damascene structure is exposed through a photo mask (101) onto second layer of photoresist (96). Being (n)-type, the regions surrounding the line pattern (97) in the second layer of photoresist, namely, regions (96), are unaffected by the exposure while region (97) is altered. After an exposure between about 20 to 200 mj/cm$^2$, the substrate is baked at a temperature between about 100–200° C. The unexposed regions is developed to delineate the metal line patterns. The negative resist is CAR type such as TOK908, for example. Another negative type resist is Navaloc base resist. Positive type resist can also be used if reversed tone mask is employed.

Figure 3F:
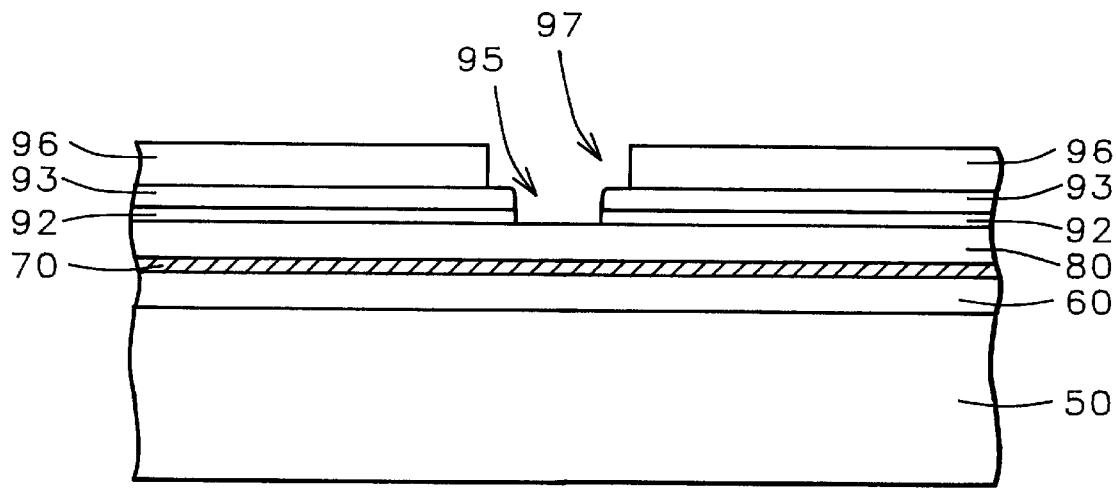
FIG. 3f is a partial cross-sectional view of a semiconductor substrate showing the forming of line pattern in the second layer of photoresist of FIG. 3e, according to this invention.

By using a conventional wet development process, such as stream puddle technique for about 45 to 65 seconds, (See S. Wolf and R. N. Tauber, "Silicon Processing for the VLSI Era," vol. 1, Lattice Press, Sunset Beach, Calif. 1986, p.443) a dual damascene structure comprising hole (95) and line (97) is formed in the first and second layers of photoresist, respectively, as shown in FIG. 3f.

Figure 3G:
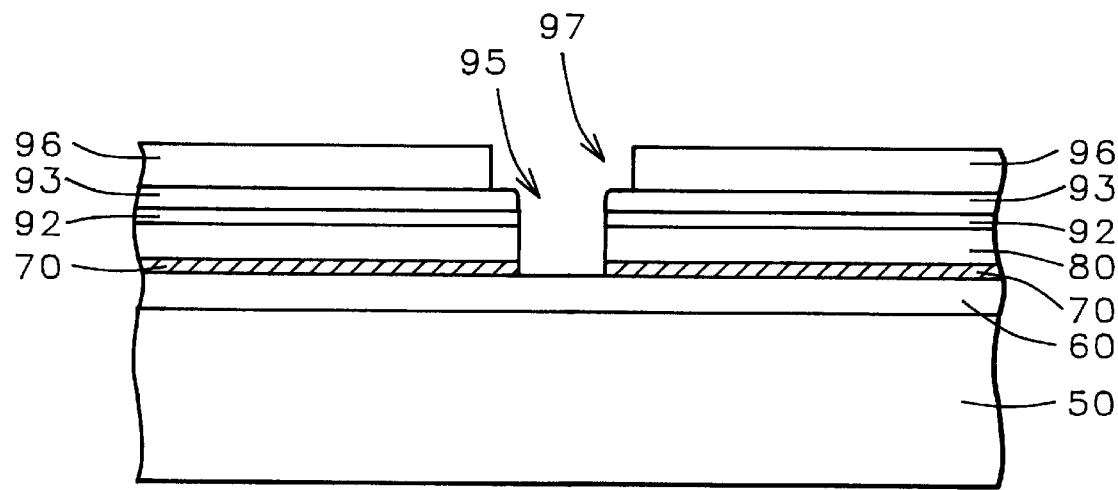
FIG. 3g is a partial cross-sectional view of a semiconductor substrate showing the transferring of the hole pattern in the first photoresist into the top and intermediate layers of the composite layer of FIG. 3f, according to this invention.
Figure 3H:
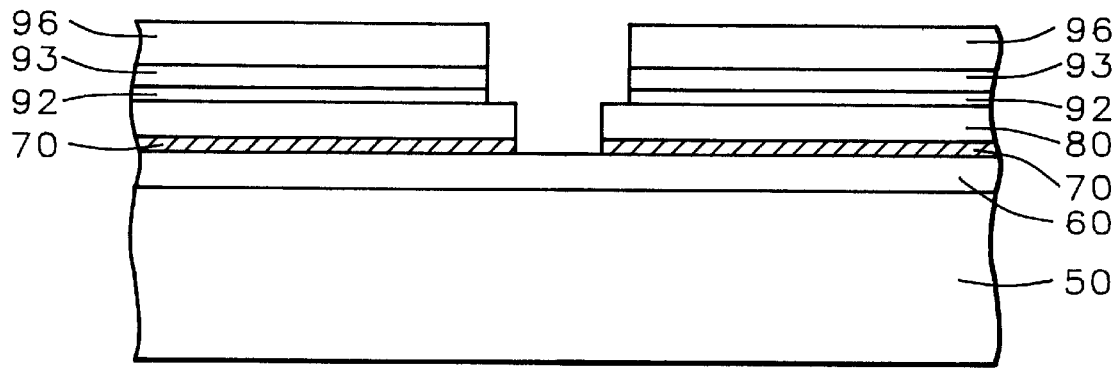
FIG. 3h is a partial cross-sectional view of a semiconductor substrate showing the transfer of the line pattern in the second layer of photoresist into the first layer of silylation photoresist of FIG. 3g, according to this invention.
Figure 3I:
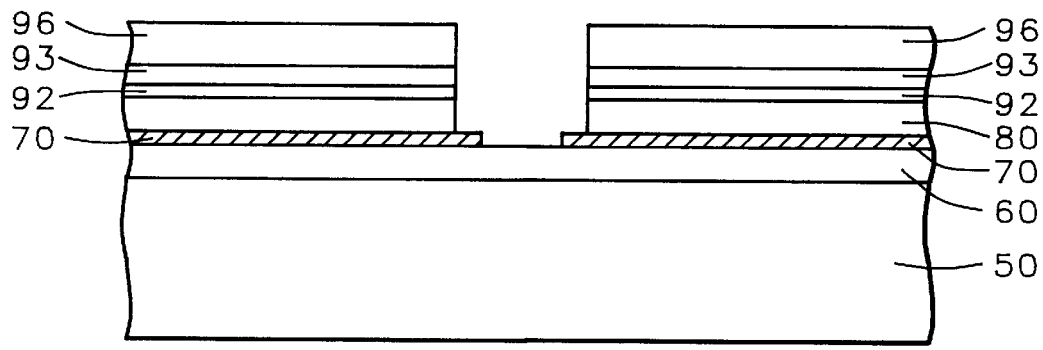
FIG. 3i is a partial cross-sectional view of a semiconductor substrate showing the transfer of line pattern in the first layer of silylation photoresist into the top layer of the composite layer to form a line trench, and the simultaneous transfer of the hole pattern in the middle layer of the composite layer into the bottom layer of FIG. 3h to form a contact hole according to this invention.

A further dry etching with a recipe comprising 50–1500 sccm Ar, 10–150 sccm CHF$_3$, 0–20 sccm C$_4$F$_8$ in a high density plasma (HDP) transfers hole pattern into the underlying insulation layers (80) and (70) as shown in FIG. 3g. Using still another resist etch, comprising 10–25 sccm O$_2$, 40–80 sccm He, 10–80 sccm SO$_2$, 0–50 sccm CF$_4$, in a HDP resist etcher system, line pattern (97) is transferred from the second layer of photoresist (96) into the lower first layer of silylation photoresist including its silylated layer (93), at the same time, etching out layer (96) as shown in FIG. 3h. It will be noted in FIG. 3h that there is thus formed a multilayered photoresist structure comprising said second and first layers of photoresist (96) and (93), including the deeper layer (92), having line pattern (97) therein. A final dry etch comprising recipe 50–150 sccm Ar, 10–150 sccm CHF$_3$, 0–20 sccm C$_4$F$_8$ in an HDP oxide etcher transfers line pattern from first layer photoresist to the second dielectric layer, while transferring the hole pattern from the second dielectric layer to the first, as shown in FIG. 3i.

Figure 3J:
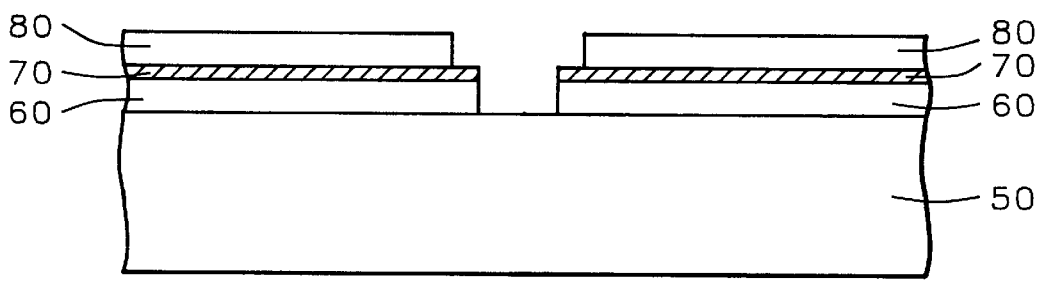
FIG. 3j is a partial cross-sectional view of a semiconductor substrate showing the dual damascene pattern in the composite insulation layer after the removal of the photoresist layers of FIG. 3i.
Figure 3K:
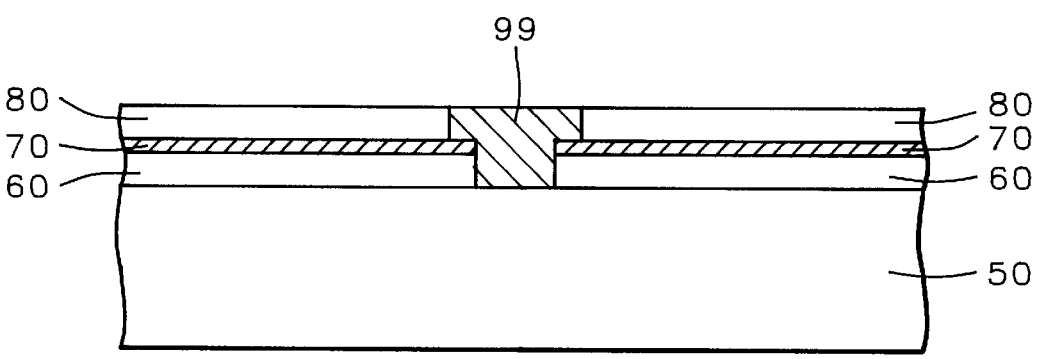
FIG. 3k is a partial cross-sectional view of a semiconductor substrate showing the depositing of metal into trench and hole of FIG. 3h to form a dual damascene structure according to this invention.

FIG. 3j shows the remaining substrate after the total removal of the first layer of silylation photoresist by using conventional ashing and wet resist strip process. Finally the dual damascene structure of FIG. 3k is formed by sputter depositing metal into the horizontal line trench and vertical hole combination in the composite insulation layer and planarizing the metal film by chemical mechanical polishing (CMP). Alternatively, the metal is electroplated to form the dual damascene structure. Preferably, the metal is copper or aluminum copper alloy which can also be electroplated.

In the descriptions of the embodiments given above, numerous details were set forth, such as specific materials, process parameter, etc., in order to provide a thorough understanding of the present invention. It will be obvious, however, to those skilled in the art that these specific details need not be employed to practice the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene pattern employing a single photolithographic top surface imaging process with a dual layered photoresist comprising the steps of:

providing a substrate having a composite layer of insulation deposited thereon whereby said composite layer comprises a first layer of dielectric separated from a second layer of dielectric by an intervening intermediate layer of etch-stop material comprising silicon nitride having a thickness between about 500 to 2000 Å;

forming a first layer of silylation photoresist on said composite layer of dielectric insulation;

hole patterning said first layer of silylation photoresist by exposing said photoresist using a photo mask;

performing a hard bake of said first layer of silylation photoresist;

treating a surface portion of said first layer of silylation photoresist with a silylation process thereby forming a silylated layer of silylation regions in said first layer of silylation photoresist;

dry etching portions of said first layer of silylation photoresist using said silylated layer of said first layer of silylation photoresist as a mask;

forming a second layer of photoresist on said first layer of silylation photoresist covering said substrate;

line patterning said second layer of photoresist by exposing said second layer of photoresist using a photo mask;

performing wet development to remove portions of said second layer of photoresist to form line pattern in said second layer of photoresist;

etching through said second layer of dielectric underlying said first layer of silylation photoresist using said silylated layer of said first layer of silylation photoresist as a mask thereby transferring said hole pattern in said first layer of silylation photoresist into said second layer of dielectric;

etching through said intermediate etch-stop layer underlying said second layer of dielectric using said silylated layer of said first layer of silylation photoresist as a mask thereby transferring said hole pattern in said first layer of silylation photoresist into said intermediate layer of dielectric;

etching said first layer of silylation photoresist through said line pattern in said second layer of photoresist thereby transferring said line pattern from said second layer of photoresist into said first layer of photoresist, while at the same time, partially etching said second layer of photoresist, thus reducing the thickness of said second layer of photoresist, and forming a multilayered photoresist structure comprising said second and first layers of photoresist having said line pattern therein;

etching said composite layer of insulation through said multilayered photoresist structure thereby transferring said line pattern in said first layer of silylation photoresist into said second layer of dielectric to form a line trench, and simultaneously transferring said hole pattern in said intermediate layer of dielectric into said first layer of dielectric to form a contact hole;

ashing and wet stripping said multilayered photoresist structure;

forming a film of metal into said trench and said hole to form a dual damascene structure; and polishing said film of metal.

2. The method of claim 1, wherein said composite layer of insulation is planarized by means of chemical-mechanical polishing (CMP).

3. The method of claim 1, wherein said first layer of dielectric of said composite layer is phosphosilicate glass (PSG) or TEOS oxide, having a thickness between about 0.3 to 0.7 micrometers ($\mu$m).

4. The method of claim 1, wherein said second layer of dielectric of said composite layer is phosphosilicate glass (PSG), or TEOS oxide, having a thickness between about 0.3 to 0.7 micrometers ($\mu$m).

5. The method of claim 1, wherein said first layer of silylation photoresist has a thickness between about 0.40 to 0.80 $\mu$m.

6. The method of claim 5, wherein said first layer of silylation photoresist is a negative chemical amplification resist (CAR) or Navaloc based resist having a photo acid generator (PAG) or photoacid compound (PAC)component, respectively.

7. The method of claim 1, wherein said hole patterning is accomplished by decomposing said PAG or PAC component in field areas adjacent to said hole pattern in said first layer of silylation photoresist exposed by said exposing through said photo mask.

8. The method of claim 1, wherein said performing a hard bake is accomplished between about 100 to 200° C. to form cross-linking in said hole pattern in said first layer of silylation photoresist.

9. The method of claim 1, wherein said silylation process is performed with tetra-methyl-di-silazane (TMDS), or HMDS, at a temperature between about 100 to 200° C.

10. The method of claim 1, wherein said silylated layer has a thickness between about 1000 to 4000 Å.

11. The method of claim 1, wherein said removal of portions of said first layer of silylation photoresist using said silylated layer as a photomask is accomplished by oxygen ($O_2$) and $SO_2$ dry etching in a high density plasma (HDP) dry etcher with a recipe comprising $O_2$ gas at a flow rate between about 10 to 250 sccm, He at 40 to 80 sccm, $SO_2$ at 10 to 80 sccm and $CF_4$ at 0–50 sccm.

12. The method of claim 1, wherein said second layer of photoresist is a negative (or, positive which is exposed using reversed tone mask) chemical amplification resist (CAR) having a photo acid generator (PAG) component.

13. The method of claim 1, wherein said second layer of photoresist has a thickness between about 0.20 to 0.80 $\mu$m.

14. The method of claim 1, wherein said transferring said hole pattern in said first layer of silylation photoresist into said second layer of dielectric is accomplished in a HDP etcher with etch recipe comprising Ar with a flow rate between about 50 to 150 sccm, $CHF_3$ between about 10 to 150 sccm, and $C_4H_8$ between about 0 to 20 sccm.

15. The method of claim 1, wherein said transferring said hole pattern in said first layer of silylation photoresist into said intermediate layer of dielectric is accomplished in a HDP etcher with etch recipe comprising Ar with a flow rate between about 50 to 150 sccm, $CHF_3$ between about 10 to 150 sccm, and $O_2$ between about 0 to 100 sccm.

16. The method of claim 1, wherein said etching said first layer of silylation photoresist through said line pattern in said second layer of photoresist thereby transferring said line pattern from said second layer of photoresist into said first layer of photoresist is accomplished in a HDP resist etcher with etch recipe comprising $O_2$ with a flow rate between about 10 to 250 sccm, He between about 40 to 80 sccm, $SO_2$ between about 10 to 80 sccm, and $CF_4$ between about 0–50 sccm.

17. The method of claim 1, wherein etching said composite layer of insulation through said multilayered photoresist structure thereby transferring said line pattern in said first layer of silylation photoresist into said second layer of dielectric to form a line trench, and simultaneously transferring said hole pattern in said intermediate etch-stop layer of dielectric into said first layer of dielectric to form a contact hole is accomplished in a HDP etcher with etch recipe comprising Ar with a flow rate between about 50 to 150 sccm, $CHF_3$ between about 10 to 150 sccm, and $C_4F_8$ between about 0 to 20 sccm.

18. A method of forming a dual damascene pattern employing a single photolithographic top surface imaging process with a dual layered photoresist comprising the steps of:

providing a substrate having a composite layer of insulation deposited thereon whereby said composite layer comprises a top layer of dielectric separated from a bottom layer of dielectric by an intervening intermediate layer of dielectric;

forming a first layer of silylation photoresist on said composite layer;

hole patterning and etching said hole into said first layer of silylation photoresist;

silylating said first layer of silylation photoresist to form a silylated glass mask comprising said hole pattern;

transferring said hole pattern in said silylated layer into the top layer of said composite layer of insulation by etching;

transferring said hole pattern in said top layer into the intermediate etch-stop layer of said composite layer of insulation by etching;

forming a second layer of photoresist on said first layer of silylation photoresist;

line patterning said second layer of photoresist;

transferring said line pattern in said second layer of photoresist into said first layer of silylation photoresist by etching;

transferring said line pattern in said first layer of silylation photoresist into said top layer of insulation to form a line trench, and simultaneously transferring said hole pattern in said intermediate layer of insulation into said bottom layer of insulation to form a contact hole; and forming a film of metal into said trench and said hole to form a dual damascene structure; and polishing said film of metal.

19. The method of claim 1, wherein said polishing is accomplished by chemical polishing.

20. A method of forming a dual damascene pattern employing a single photolithographic top surface imaging process with a dual layered photoresist comprising the steps of:

providing a substrate having a composite layer of insulation deposited thereon whereby said composite layer comprises a top layer of dielectric separated from a bottom layer of dielectric by an intervening intermediate layer of dielectric comprising silicon nitride with a thickness between about 500 to 2000 Å;

forming a first layer of silylation photoresist on said composite layer;

hole patterning and etching said hole into said first layer of silylation photoresist;

silylating said first layer of silylation photoresist to form a silylated glass mask comprising said hole pattern;

transferring said hole pattern in said silylated layer into the top layer of said composite layer of insulation by etching;

transferring said hole pattern in said top layer into the intermediate etch-stop layer of said composite layer of insulation by etching;

forming a second layer of photoresist on said first layer of silylation photoresist;

line patterning said second layer of photoresist;

transferring said line pattern in said second layer of photoresist into said first layer of silylation photoresist by etching;

transferring said line pattern in said first layer of silylation photoresist into said top layer of insulation to form a line trench, and simultaneously transferring said hole pattern in said intermediate layer of insulation into said bottom layer of insulation to form a contact hole; and forming a film of metal into said trench and said hole to form a dual damascene structure; and polishing said film of metal.

21. The method of claim 20, wherein said first layer of silylation photoresist is (p)-type chemical amplification resist (CAR) having a photo acid generator (PAG) agent, or (p)-type Novalac based photoresist having a photoacid compound (PAC) agent, or (p)-type Novalac based photoresist having a photoacid (PAC) agent.

22. The method of claim 20, wherein said silylating is accomplished with tetra-methyl-di-silazane (TMDS), or HMDS at a temperature between about 100 to 200° C.

23. The method of claim 20, wherein said silylated glass mask has a thickness between about 1000 to 4000 Å.

24. The method of claim 20, wherein said second layer of photoresist is (n)-type chemical amplification resist (CAR) having a photo acid generator (PAG) agent, or (p)-type with reversed tone mask.

25. The method of claim 20, wherein said transferring said line pattern in said first layer of silylation photoresist into said top layer of insulation to form a line trench, and simultaneously transferring said hole pattern in said intermediate etch-stop layer of insulation into said bottom layer of insulation to form a contact hole is accomplished in a HDP etcher with etch recipe comprising Ar with a flow rate between about 50 to 150 sccm, $CHF_3$ between about 10 to 150 sccm, and $C_4H_8$ between about 0 to 20 sccm.

26. The method of claim 20, wherein said forming metal into said trench and said hole is accomplished by sputter depositing or electroplating copper or aluminum copper alloy.

27. The method of claim 20, wherein said polishing is accomplished by chemical mechanical polisihing.

* * * * *